United States Patent [19]

Aoki et al.

[11] 4,382,454
[45] May 10, 1983

[54] BORON CANTILEVER PIPE

[75] Inventors: Masaki Aoki, Hirakata; Shigeru Yoshida, Kadoma; Hiroshi Yamazoe, Katano; Masahiro Nagasawa, Hirakata, all of Japan

[73] Assignee: Matsushita Electric Industrial Co., Ltd., Japan

[21] Appl. No.: 244,643

[22] Filed: Mar. 17, 1981

Related U.S. Application Data

[62] Division of Ser. No. 102,846, Dec. 12, 1979, Pat. No. 4,279,691.

[30] Foreign Application Priority Data

Dec. 12, 1978 [JP] Japan ................ 53-153936

[51] Int. Cl.$^3$ ............................ F16L 9/14; G11B 3/02
[52] U.S. Cl. .................................. 138/140; 138/141; 138/172; 138/177; 138/178; 428/36; 428/586; 369/170

[58] Field of Search ............... 138/137, 140, 141, 143, 138/172, 174, 177, 178; 428/36, 586; 156/656, 664; 252/79.1; 369/170; 43/18 GF

[56] References Cited

U.S. PATENT DOCUMENTS

| | | | |
|---|---|---|---|
| 2,438,111 | 3/1948 | Campbell | 369/170 |
| 3,918,723 | 11/1975 | Nakajima et al. | 369/170 |
| 3,961,797 | 6/1976 | Tsukagoshi | 369/170 X |
| 3,974,012 | 8/1976 | Hogarth | 428/36 X |

Primary Examiner—James E. Bryant, III
Attorney, Agent, or Firm—Wenderoth, Lind & Ponack

[57] ABSTRACT

This invention relates to a boron cantilever in pipe form, composed of an inner layer of crystal boron and an outer layer of amorphous boron and to a method for producing it. The cantilever is particularly useful for supporting a phonographic pickup stylus.

4 Claims, 2 Drawing Figures

2  AMORPHOUS BORON

2'  CRYSTAL BORON

1 TANTALUM WIRE
2 BORON
3 CHROMIUM BORIDE
4 AIR GAP

2 AMORPHOUS BORON
2' CRYSTAL BORON

BORON CANTILEVER PIPE

This is a divisional of Ser. No. 102,846, filed Dec. 12, 1979, now U.S. Pat. No. 4,279,691.

BACKGROUND OF THE INVENTION

This invention relates to a boron cantilever and a method of making the same, particularly to a boron pipe cantilever for supporting a pickup stylus for converting shape signals recorded on a recording medium to electric signals, and a method of producing such cantilevers with a high production yield. According to this invention, a boron cantilever, particularly a boron pipe cantilever having a high mechanical strength and an excellent elastic ratio, $E/\rho$, can be obtained, where E is elastic modulus and $\rho$ is density.

Boron is known to have a hardness next to that of diamond and a very large resistance to abrasion, so that it is useful e.g. for cutting tools, sliding components and bearings. Further, since it has a low density and a large elastic modulus, the elastic ratio is largest among all the presently known materials. This means that the sound wave propagation velocity in boron material is highest among the presently known materials, so that boron is particularly useful for a cantilever for supporting a pickup.

It is difficult to obtain a dense body of boron by casting methods or rolling methods. So, usually, for making a boron cantilever, a boron coating is formed on a substrate other than boron by the vacuum deposition method, sputtering method or chemical vapor deposition (CVD) method, whereby the cantilever is composed of not only boron but also the substrate. This is disadvantageous, because the properties of the cantilever are deteriorated by the use of such substrate. It has been attempted to chemically or physically separate the boron layer from the substrate for obtaining a pure boron cantilever. However, there has been suggested no effective methods therefor. Further, according to the usual method, strain occurs between the boron layer and the substrate due to the thermal expansion difference between them, so that cracks are likely to occur in the boron layer, and thus it is difficult to obtain, in high production yield, a boron cantilever, having a high mechanical strength.

The present inventors have conceived of and attempted various methods for eliminating the above described disadvantages of the conventional methods and of the conventional boron cantilevers, namely for obtaining pure or substantially pure boron cantilevers, particularly pipe cantilevers, having a high mechanical strength and a large elastic ratio in a high production yield. Thereby, a novel boron cantilever and a novel method of making the same having been invented in accordance with this invention.

BRIEF SUMMARY OF THE INVENTION

The foregoing objectives are realized by the provision of a boron cantilever in pipe form, composed of an inner layer of crystal boron and an outer layer of amorphous boron. This structure is realized by formation of the crystal and amorphous boron layers on a substrate and then removing the substrate.

The main features of this invention are as follows:

(1) A boron cantilever, particularly pipe form, made by separating the boron layer from a boron layer-substrate combination (which substrate is made of a metal or a metal boride) by etching the substrate.

(2) A boron cantilever made by coating chromium or chromium alloy with iron, cobalt, nickel, zirconium, aluminum, vanadium or silicon, or one of their borides of an appropriate thickness on a substrate, CVD-depositing boron on the coating, and etching the substrate.

(3) A boron cantilever made by coating an amorphous boron layer on a metal substrate, heating it for diffusing boron into the metal substrate to form a boride layer, CVD-depositing boron on the boride layer, and etching at least the metal substrate.

(4) A boron cantilever made by CVD-depositing a crystal boron layer on a metal substrate, CVD-depositing an amorphous boron layer on the crystal boron layer, and etching the metal substrate for forming a boron double layer.

(5) A boron cantilever made by CVD-depositing a 1st amorphous boron layer on a substrate, CVD-depositing a 2nd boron layer on the first boron layer, . . . , and CVD-depositing an n-th boron layer on the (n−1)-th boron layer for forming an amorphous boron multi-layer.

Excellent results can be obtained by one or a combination of the above five points.

DETAILED DESCRIPTION

Figure 1:
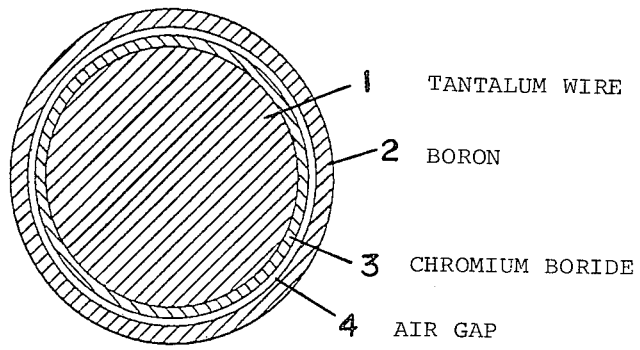
FIG. 1 is a schematic depiction of a cross-section of a wire having a chromium boride inner layer and boron outer layer.

In the following, the CVD method will be described.

A substrate is placed in a reaction chamber. It is then heated by infrared ray heating, high frequency heating, resistor heating or current heating. Then, a boron halide gas and hydrogen gas are introduced into the chamber. Thereby, boron is separated on the substrate according to the following reaction.

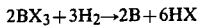

$$2BX_3 + 3H_2 \rightarrow 2B + 6HX$$

where X is Cl, Br or I. Instead of boron halides, boron hydrides can also be used. By the boron separation reaction, various crystal forms of boron can be obtained depending e.g. on the heating temperature, the gas pressure and the amount of the introduced gas. Among the various forms, β-rhombohedral, tetragonal and amorphous borons are preferable in view of high density and high mechanical strength. Amorphous boron is most preferable. Each form can be used alone, or two or all of them can be used together.

For removing the substrate, chemical treatment such as etching is used. The substrate is required to be refractory because the CVD-deposition of boron is done at a high temperature (900° C. or higher). Preferred examples of the materials of substrate are metals such as iron, tantalum, niobium, molybdenum, tungsten and titanium because they can be formed to a complicated substrate structure and can be easily heated by current application or high frequency application. Among them, the more preferred ones are tantalum, molybdenum and tungsten because they can become less weakened by hydrogen than the other examples upon being exposed to hydrogen in the CVD process. In order to minimize the thermal strain between the deposited boron layer and the substrate, it is most preferable to use tantalum or titanium having thermal expansion coefficients of about 7 to $8\times 10^{-6}/°$ C. and about $8\times 10^{-6}/°$ C., respectively, which are most close to the thermal expansion coefficient of boron which is $8\times 10^{-6}/°$ C.

This invention will be detailedly described hereinafter.

In order to remove the metal substrate from the substrate-boron layer combination in which the boron layer is formed by CVD process, the combination is immersed in a solution having one or more of bromine, iodine, iodine trichloride, iodine monochloride or, iodine monobromide dissolved in an alcohol. Thereby, the metal substrate and, if necessary, the metal boride layer can be removed. Thereby, a boron pipe cantilever can be obtained. It may be considered to use an aqueous solution of an acid, an alkali or a salt instead of an alcohol solution. However, according to the present inventors' experiments, most of such aqueous solutions have been found to dissolve or etch not only the metal substrates but also the boron layer. It may not be impossible to apparently dissolve or etch only the substrate by adjusting the combination or concentration of such acid, alkali and salt. However, upon dissolving the metal substrate into the aqueous solution, gases are produced which then cover the surface of the metal substrate. Once the substrate is covered with the gases, the dissolving speed of the metal substrate becomes extremely low. Further, the boron cantilever made by removing the substrate by the aqueous solution has very low mechanical strength. Upon observing the thus obtained boron cantilever using a microscope, corrosion traces are often observed along crystal grain boundaries.

Etchants of methanol or ethanol having bromine ($Br_2$) or iodine ($I_2$) dissolved therein are known as etchants for etching metals and intermetallic compounds. The present inventors have found that metals and metal borides can be dissolved or etched by an etchant of an alcohol having one or more of bromine ($Br_2$), iodine ($I_2$), iodine trichloride ($ICl_3$), iodine monochloride ($ICl$) and iodine monobromide ($IBr$) dissolved therein, without dissolving or etching boron. That is, the present inventors have found an etchant which selectively etches metals such as tantalum. The alcohols referred to herein are lower alcohols. Particularly preferred ones are methanol and ethanol. The most preferred one is the latter in view of less toxicity, higher boiling point and easier handling. Better results can be obtained when such alcohol has less moisture content. As the moisture content increases, the resultant boron cantilever has worse properties. That is, absolute alcohol produces best results. But an alcohol with a moisture content of up to about 5% can be satisfactorily used if the thickness of the deposited boron layer on the substrate to be etched is large, or if the material of the substrate is adequately selected.

When bromine is used, a proper etchant can be obtained by merely dropping a necessary amount of liquid bromine into an alcohol and stirring the alcohol. When solid iodine is used, a proper etchant can be obtained by throwing a necessary amount of solid iodine into an alcohol and stirring the alcohol for dissolving the iodine therein. In this case, a saturated solution can be easily obtained by using an excessive amount of solid iodine.

Among the above described halogens, bromine is most preferable because it is easier to handle, and it has a larger etching effect. Iodine is easiest to handle, although it has less etching effect than bromine. Iodine trichloride, iodine monochloride and iodine monobromide are also solids, so that they can be treated in the same manner as for solid iodine. Although iodine monobromide is deliquescent, it is not a problem from a practical point of view. Further, these solids do not substantially produce a halogen gas by themselves or from alcohol solutions thereof. Iodine trichloride has about the same etching effect as bromine, next to which is iodine monochloride. The highest etching speed is obtained with a saturated solution, but unsaturated solutions can also be put to practical use. Further, two or three of chlorine, bromine and iodine can be simultaneously dissolved in alcohol in molecular form.

In etching or dissolving the metal substrate, it is effective to stir the etchant or apply ultrasonic vibration to the etchant for promoting the dissolution of the metal substrate. Such promotion can also be realized by heating the etchant. However, excessive heating causes dissolving of or etching of boron, so care should be paid in heating the etchant. Usually, an appropriate temperature range therefor is 20° to 50° C. After a boron cantilever is obtained by etching a combination of boron layer-metal substrate, the boron cantilever should be washed by using e.g. alcohols.

In the case when a boron layer is CVD-deposited on a metal plate, a metal boride is formed between the boron layer and the metal substrate because the metal substrate is heated to a high temperature. However, as above-described such a metal boride layer can also be etched or dissolved away by using the above-described etchants.

As to the form of the metal substrate, preferred ones are determined by the form of the desired pipe cantilevers. Usually, a plate or rod form having a rectangular cross section or a wire form having a circular cross section is preferable, because if the form is too complicated, it takes a long time to etch away the substrate, and further the strains in the combination of metal substrate-boron layer are likely to remain unmitigated so that cracks are likely to occur in the boron layer.

It has been further found according to this invention that if chromium, chromium boride, an alloy of chromium plus one of iron, cobalt, nickel, zirconium, aluminum, vanadium and silicon, or a boride of such alloy is coated on the above-described metal substrate by electroplating, CVD (using e.g. chromium iodide), or sputtering, and a boron layer is deposited on the thus coated metal substrate, occurrence of cracks in the boron layer can be prevented, and the obtained boron layer (pipe boron cantilever) has a high mechanical strength.

The following experiments have been made using a chromium plate because an appropriate chromium wire is not easily available. That is, when a chromium plate was used as a metal substrate, and boron was CVD-deposited on the plate, the plate was deformed by the heating of CVD. Further, since chromium has a large thermal expansion coefficient, the CVD-deposited boron layer became cracked or broken at the end of the CVD. Similar troubles appeared when chromium of a lump form or a plate of the above-described chromium alloy was used instead of the chromium plate.

Thus, for attaining the above-described effect found by this invention, the thickness of the chromium coating on the metal substrate should be appropriately selected. This preferred thickness depends a little on the thickness of the metal substrate also. When a tantalum wire has a circular cross section of 200 to 300 micron diameter, a preferred thickness of the chromium, chromium alloy, chromium boride or chromium alloy boride is 0.1 to 20 microns. A too thick chromium coating is likely to cause cracking in the resultant boron layer, while a too thin chromium coating does not produce the intended effect. The most preferable thickness of the chromium coating is 0.5 to 2 microns.

Preferred materials for the metal substrate on which the chromium coating is to be applied are tantalum, niobium, molybdendum, titanium and tungsten. The most preferred one is tantalum. This is considered to be because the thermal expansion coefficient of tantalum is close to that of boron, and tantalum is little weakened by hydrogen, and presumably because of good reaction between tantalum and the chromium coating. As an experiment, chromium of about 3 microns was coated on a tantalum wire having a 250 micron diameter, and on the chromium coated wire, boron was CVD-deposited. The cross section of the thus obtained material is schematically shown in FIG. 1. Referring to this drawing, reference numeral 1 designates a tantalum wire, 2 is a boron layer. An X-ray diffraction analysis shows that 3 is a chromium boride layer. 4 designates an air gap. It is thus apparent that the chromium layer preliminarily coated on the tantalum wire is usually converted to chromium boride upon the CVD-deposition of boron. Sometimes, the air gap 4 is not observed by a microscopic observation.

It is considered that the effect of the chromium coating is attributed to the fact that the thermal expansion coefficient of the chromium coating (actually chromium boride coating) is larger than that of boron, and that the bonding between the chromium layer and the boron layer is relatively weak, resulting in a larger or smaller air gap between the chromium layer and the boron layer. Thus, the thermal strain existing between the metal substrate and the boron layer is considered to be mitigated by the air gap, which leads to the suppression of the cracking or breaking of the resultant boron pipe cantilever and to the improvement of production yield.

Among the above-described operable materials for the chromium coatings, chromium, chromium boride, chromium-iron alloy and boride of chromium-iron alloy are more preferred in view of production yield and mechanical strength of resultant boron cantilevers. If the chromium coating is chromium alloy, the sputtering method is most convenient among the coating methods. There is no observable difference between the chromium boride layer made by reacting the chromium layer on the metal substrate with a boron halide and the chromium boride layer made by sputtering chromium boride on the metal substrate. The provision of the chromium coating contributes to the improvement of the mechanical strength of the CVD-deposited boron layers irrespective of the crystal forms of the boron layers, although a deposited amorphous boron layer and a deposited β-rhombohedral boron layer are stronger than other forms of deposited boron layers.

It has been further found according to this invention that if (a) an amorphous boron layer of an appropriate thickness is formed on the metal substrate, (b) the thus formed amorphous boron is diffused into the metal substrate by heat treatment, and (c) a dense and strong boron layer is coated by CVD on the thus boron-diffused metal substrate, a mechanically strong boron pipe cantilever made of the CVD-deposited boron layer can be obtained, in which cracking or breaking does not occur upon separating the boron layer from the metal substrate, namely upon dissolving or etching the metal substrate by the afore-described selective etchant.

Crystal forms of boron layers CVD-deposited on the metal substrates can be varied by varying the heating temperature of the metal substrates for CVD. At 800° to 1200° C., amorphous boron is obtained, while at above around 1200° C., borons of α-rhombohedral form, β-rhombohedral form and tetragonal form are obtained. If the heating temperature is lower than about 800° C., boron separation speed by the CVD is too low, and the separated or deposited boron is in a powder form. So, it becomes difficult to diffuse the amorphous boron into the metal substrate by the heat treatment. On the other hand, if the heating temperature is above about 1200° C., α- and β-rhombohedral borons are separated or deposited, and it becomes difficult to obtain amorphous boron. Borons of crystal forms, namely those other than amorphous boron are not sufficiently diffused into the metal substrates upon the diffusion heat treatment. So, the intimacy between the metal substrates and the separated boron becomes insufficient. This causes cracks and/or breaking in the separated boron layer on the metal substrate, resulting in low mechanical strength and low elastic or Young's modulus of the resultant boron cantilevers.

The temperature of the heat treatment for boron diffusion, after the amorphous boron separation, should not be lower than 1200° C., because otherwise the diffusion takes too long a time. However, too high a temperature is also not preferable. If it is higher than 1500° C., the diffusion speed is too fast, resulting in the formation of a non-uniform metal boride layer on the metal substrate. This causes low mechanical strength of the boron layer as a cantilever. The crystal forms of the boron layer on the boron-diffused metal substrate are preferably amorphous or β-rhombohedral.

It has been found according to this invention that a boron pipe cantilever of two boron layers, made by CVD-depositing a crystal boron layer on a metal substrate, further CVD-depositing an amorphous boron layer on the crystal boron layer, and removing the metal substrate using a selective etchant, has a high mechanical strength and can be produced with a high production yield. Preferred metal substrates are tantalum, niobium molybdendum, tungsten and titanium, and the most preferred one is tantalum as described above.

Preferred crystal borons, as the first layer, are β-rhombohedral boron and a mixed crystal of β-rhombohedral and tetragonal borons. The use of α-rhombohedral is not preferred because the resultant layer surface is likely to be rough.

The preferred thickness of the first layer, i.e. crystal boron, is 0.5 to 10 microns. Too thin a first layer is not effective for obtaining a high elasticity of the resultant cantilever, and too thick a first layer is not preferred for obtaining a high mechanical strength of the cantilever.

It has been found according to this invention that a stronger boron cantilever can be obtained by a boron multi-layer pipe, in which each layer is in a limited thickness. The thickness of the wall of the pipe cantilever is determined by required weight of the cantilever, required acoustic properties, etc. It has been found according to this invention that a boron cantilever pipe having a certain wall thickness and composed of plural boron layers is stronger than a boron cantilever having the same wall thickness composed of a single boron layer.

Among various known methods for forming a boron layer, the above-described CVD is considered to produce the best quality boron layer. By CVD, forms of deposited borons such as β-rhombohedral, α-rhombohedral, tetragonal, amorphous and their mixed crystals can be varied by varying conditions of CVD. Generally, a pure amorphous boron layer is best in view of mechanical properties such as tensile strength.

However, commercially available boron fibers are sometimes mechanically weak due to porosities, inner strains, micro-cracks, etc. Further, when a metal substrate having an amorphous boron layer thereon is removed by, for example, etching the metal substrate, the amorphous layer sometimes gets broken. This is considered to be because of the inner strains in the boron layer.

On the other hand, a CVD-deposited boron multi-layer on a metal substrate according to the finding of this invention is strong even after the removal of the metal substrate, and is good in appearance also. The thus prepared boron cantilever is excellent as a cantilever and a vibration plate of a sound speaker also.

In this case, the thickness of each amorphous boron layer in the multi-layer structure is preferably between 3 and 15 microns. If the thickness is too small, it is difficult to produce a uniform thickness multi-layer, and takes a long time to prepare a given thickness of the multi-layer. If the thickness is too large, boron crystals are likely to occur locally, and abnormal growth of amorphous boron is also likely to occur, resulting in a decrease of mechanical strength.

Multi-layered amorphous boron cantilevers have been made by various methods, and it has been found that the thus made cantilevers are superior to those of mono-layer amorphous boron as to the layer quality and ease of controlling production conditions.

The points which will be described hereinafter are directed to the CVD method for obtaining amorphous boron layers. Conventionally, in order to obtain a thick amorphous boron layer by CVD, boron is CVD-deposited at a relatively low temperature, or a large amount of starting gas is fed to a reaction chamber. A disadvantage of such methods is that the starting gas is not efficiently used. Another disadvantage is that the deposited boron layer is likely to abnormally grow, and a crystal boron is likely to be produced locally, when the temperature of the metal substrate fluctuates and/or when there is a foreign matter on the metal substrate. A further disadvantage is that the mechanical strength of the deposited boron layer is low. This low mechanical strength is likely to become remarkable when the metal substrate is removed e.g. by etching.

The method according to this invention comprises a process of gradually increasing the thermal energy applied to the metal substrate during a constant amount of an introduced flowing starting gas in the reaction chamber, and a process of cutting off the thermal energy application when the temperature of the metal substrate reaches to a predetermined temperature. By repeating these two processes, plural amorphous boron layers are formed on the metal substrate. By using this method, the temperature of the metal substrate (i.e. the predetermined temperature) can be higher than the conventional upper limit temperature for producing an amorphous boron layer. That is, according to the conventional method, when the temperature is above the upper limit, crystalline boron is formed. On the other hand, according to this invention, the predetermined temperature is not maintained for a long time, so that the formation of boron crystals is preventable. Amorphous borons made at a higher reaction temperature are better in layer properties than those made at a lower reaction temperature.

In the first process, namely the process of gradually increasing the temperature of the substrate, amorphous boron becomes deposited when the temperature reaches a certain point. When the thermal energy supply is stopped soon thereafter, the substrate temperature rapidly decreases, whereby the boron deposition is stopped. The thus formed or deposited boron layers are of uniform amorphous boron without any abnormal growth or local crystallization.

According to the above-described method, the thickness of each amorphous boron layer formed by one cycle of the first and second processes is thin, because the time in which the amorphous boron is deposited is short. In order for each amorphous boron layer to have a relatively large thickness, the metal substrate should be kept for a certain time period at the predetermined temperature before the cut-off of the thermal energy supply after the temperature of the substrate has reached the predetermined temperature by gradually heating the substrate. While the substrate is kept at the predetermined temperature, boron continues to be deposited on the substrate whereby a comparatively thick boron layer is obtained. The time period for which the predetermined temperature can be kept depends on the predetermined temperature. If the time period is too long, abnormal growth of boron is likely to occur.

The above method is effective in both the cases of CVD under a reduced pressure and CVD under an ordinary pressure. By using such a higher substrate temperature, the starting gas can be more efficiently utilized. As a modification of this method, the first layer on the substrate can be a crystal boron layer, with the remaining plural boron layers being amorphous boron layers. Such modified structure also is superior to the conventional structure as to mechanical strength and appearance. In this modified case, the preferable thickness of the first layer (crystal boron) is 0.5 to 10 microns.

This invention will be described in detail hereinafter in the following Examples. However, it should be noted that these Examples are meant to only illustrate this invention, and are not intended to limit the scope of this invention.

EXAMPLE 1

A tantalum wire having a cross section of 300 micron diameter was prepared as a metal substrate. By using a mixed gas of boron trichloride and hydrogen, a boron layer of 100 microns thickness was deposited on the tantalum wire using CVD method. The temperature of the wire was kept at 1300° C. by directly flowing a current through the wire. It was found by X-ray diffraction analysis that the thus deposited boron was crystalline.

The thus prepared wire with the boron layer was cut into wire segments by planes perpendicular to the axis of the wire by using a YAG laser. The wire segments were immersed in various processing liquids (etchants) listed in Table 1, respectively. The processing liquids were each put in a sealed container for preventing mix-in of moisture from the ambient air and alsor for preventing evaporation of the contents of the processing liquids. Each liquid was kept at room temperature and was supplied with constant ultrasonic vibrations. Table 1 lists time required for completely dissolving the wire in each wire segment, and mechanical strength of the thus obtained boron pipe from each wire segment. The mechanical strength is defined by a minimum load required for breaking each boron pipe when both ends of the boron pipe are supported while the load is applied to the center of the boron pipe. (Unless otherwise noted, the mechanical strength herein is defined in this manner.)

It is apparent from this Table 1 that the etchants described afore according to this invention are superior to others, and that among them, best ones are those using bromine and iodine trichloride.

By using the same etchants as those above and by substituting W, Ni, Ti, Mo, Fe and stainless steel for tantalum, similar experiments to those done above were performed. Thereby it was found that operable boron pipes were obtained by using the etchants according to this invention, although the properties of the thus obtained resultant ones were a little inferior to those of the tantalum case.

Observing the etching processes of the tantalum wire segments using the etchants of this invention, it was observed that the etchants could dissolve not only tantalum but also tantalum boride thereon.

Instead of tantalum of wire form, a thin tantalum plate was used as a substrate, and was subjected to the same experiments as done above. Thereby, similar results to those obtained above were obtained. Instead of absolute methanol, absolute ethanol was used, and was subjected to the same experiments as done above. Thereby, similar results to those obtained above were obtained. When the substrates were iron and stainless steel, good results were obtained also by using a commercially available alcohol instead of the absolute methanol, although the etching speed was a little slower in such case.

As to the substrates of W, Ni, Ti, Mo, Fe and stainless steel, selective etching of the substrates was tried by using appropriate acids and alkaline liquids. However, in all such cases, the boron layers were very much damaged thereby.

The elastic ratio of each of the above obtained boron pipes according to this invention was about $15 \times 10^8$ cm.

EXAMPLE 2

Four tantalum wires each of 250 micron diameter were heated by an appropriate means to various temperatures listed in Table 2 in a reaction chamber for the CVD method, and on each of such wires, a boron layer of 50 microns was deposited by CVD as in Example 1. Each of the thus treated wires was cut into plural wire segments as in Example 1, and each wire segment was immersed in an etchant made by introducing 25 grams of bromine in 100 ml of absolute methanol and stirring it. This immersing treatment is maintained for 20 hours with the etchant being supplied with ultrasonic vibrations during the immersing. Measured results as to the thus obtained boron pipes are listed in Table 2.

As apparent from this table, boron pipes having proper mechanical strengths can be obtained according to this method with various crystal forms of boron. However, it is also apparent from Table 2 that the obtained mechanical strengths depend on the crystal forms of boron. Further, the elastic ratios of the thus obtained boron pipes were similar to the elastic ratio obtained in Example 1 although the elastic ratios obtained here were a little different from each other depending on the crystal forms of deposited boron.

It was confirmed here that boron pipes having sufficient mechanical strengths had elastic ratios of $13 \times 10^8$ to $15 \times 10^8$ cm. So, it is apparent that the confirmation of the mechanical strengths of boron pipes substantially gives confirmation of the elastic ratios of the boron pipes without necessitating direct measurements of elastic ratios.

EXAMPLE 3

Seventeen tantalum wires each of 300 micron diameter were prepared. On the wires, except one, chromium and chromium boride were coated to various thicknesses and by various coating methods as listed in Tables 3A and 3B. On each of the thus treated sixteen wires and the remaining one wire, a crystal boron layer of 70 microns was deposited by CVD. By cutting each wire by a plane perpendicular to the wire axis, wire segments each of about 10 mm was made. Each of the thus made seventeen kinds of wire segments was immersed in an etchant according to this invention for 50 hours in a similar manner to that of Example 1, in order to remove the metal substrate and thereby make a boron pipe.

The mechanical strengths and the production yields of thus made boron pipes are listed in Tables 3A and 3B. It is apparent from these tables that the chromium coating contributes to strengthening the resultant boron pipes.

When tantalum was replaced by W, Ti, Ni and Mo, the chromium coating including chromium boride contributed to the strengthening of resultant boron pipes, although the strengthening effect here was a little less than that in the case of tantalum. Care should be taken to select appropriate preparation conditions for obtaining good boron pipes, because mutual diffusion between chromium and the metal substrate becomes remarkable at high temperatures.

When a tantalum thin plate was used instead of the tantalum wire and was subjected to the same experiments as done above, similar desired results were obtained. Further, when an amorphous boron layer was deposited on the metal substrate instead of the crystal boron layer, similar contribution of the chromium coating to the strengthening of a resultant boron pipe was confirmed.

EXAMPLE 4

Twenty-four tantalum wires each of 200 micron diameter were prepared. On these wires, except two, chromium, alloys of chromium with iron, cobalt, nickel, zirconium, aluminum, vanadium and silicon and their borides were coated by various coating methods as listed in Table 4. On each of these twenty-four wires, layers of borons crystals and amorphous boron each of 30 microns were CVD-deposited. Each wire was cut into wire segments each of 3 mm length, and the thus made wire segments were immersed in an etchant according to this invention for removing the metal substrates so as to obtain boron pipes. Table 4 lists the thickness of each chromium coating, production yield of each case, mechanical strength of each boron pipe and the crystal form of each boron pipe (layer).

As apparent from Table 4, the chromium coatings according to this invention contribute to the strengthening of resultant boron pipes. Among the various chromium coatings, chromium-iron alloy and its boride are most effective for the purpose to about the same extent as in the case of chromium and its boride. The preferred amount of iron in the chromium-iron alloy is up to 30 atom %. The preferred amount of cobalt in chromium-cobalt alloy is up to 20 atom %. The preferred amount of nickel in chromium-nickel alloy is up to 10 atom %. Such preferred amounts apply to the cases of their borides also. Further, in the cases of alloys of chromium each with zirconium, aluminum, vanadium and silicon and their borides, the preferred amount of chromium therein is from 20 to 100 atom %.

If chromium is not used and one of iron, cobalt and nickel is used as a coating on the tantalum metal substrate, the desired effect of the coating may be obtained. But such coating has a disadvantage in that it is difficult to control the CVD conditions then.

When each of W, Ti, Ni and Mo was used instead of tantalum and was subjected to the same experiments as performed above, operable boron pipes were obtained, although some of the thus obtained boron pipes were a little inferior to those of the tantalum case. In of this Example as well, care should be taken to select appropriate preparation conditions for obtaining good boron pipes, because mutual diffusion between chromium coating and the metal substrate becomes remarkable at high temperatures. Similar good results were obtained even when each tantalum wire was replaced by a tantalum plate or a tantalum rod having a rectangular cross section.

As is apparent from this Example, chromium coatings are effective irrespective of methods of dissolving the metal substrates. Combining the technique of chromium coatings with other unique techniques of this invention, results in interaction between them to produce better effects. The thus obtained boron pipes in this Example had elastic ratio values each of about $15 \times 10^8$ cm.

EXAMPLE 5

Two tungsten wires and twelve tantalum wires each of 400 microns in diameter were prepared. On each of the wires, a boron layer 60 microns thick was CVD-deposited as follows. At first, a thin amorphous layer was CVD-deposited on the wire, and was heated for diffusing the thus deposited boron into the wire, leaving no thickness of the firstly deposited amorphous boron layer. This deposition and diffusion process usually take a few minutes at longest. Next, a boron layer 60 microns thick was CVD-deposited on the thus treated wire, and was cut into wire segments. The thus obtained wire segments were subjected to an etching process for forming boron pipes. Features of the method and the properties of the boron pipes are listed in Table 5.

It is apparent from Table 5 that mechanically strong boron pipes can be obtained by this invention. Preferable temperature for forming the first amorphous boron layer is 900° to 1100° C. Further, preferable temperature for diffusing the first amorphous layer into the wire is 1200° to 1300° C. The thus obtained boron pipes each had an elastic ratio of about $14 \times 10^8$ cm.

It should be noted that sample Nos. 1 to 3 of Table 5 are comparative samples made for comparison. The mechanical strengths in the Table are defined as relative values on the basis that the mechanical strength of a boron pipe of β-rhombohedral form made by a conventional method using a tungsten wire as a metal substrate is 100.

It was confirmed that the three processes in this method could be performed under ordinary gas pressure or reduced gas pressure, for obtaining similar results, although the reduced gas pressure is more preferable e.g. because the temperature uniformity of the metal substrate is better. Further this method is applicable for a metal substrate having any cross section.

EXAMPLE 6

Two tungsten wires and ten tantalum wires each of 200 micron diameter were prepared. A crystal boron layer was CVD-deposited on each of nine wires at a high temperature, and on the thus deposited crystal boron layer, an amorphous boron layer was CVD-deposited by using a lower temperature. The thus obtained double boron layer had a thickness of 30 microns. On each of the other three wires, a crystal boron single layer or an amorphous boron single layer was CVD-deposited. Each of the thus treated wires was cut into wire segments, and these wire segments were subjected to the etching for producing boron pipes.

Table 6 lists the structure of the boron layers of the thus obtained boron pipes, and the measured mechanical strengths thereof, wherein each mechanical strength therein is a relative value on the basis that the mechanical strength of the β-rhombohedral boron pipe made from a tungsten wire substrate is 100. In Table 6, sample Nos. 1 to 3 are comparative samples listed for comparison.

It is apparent from Table 6 that the unique boron pipes thus obtained have excellent mechanical strengths. The elastic ratio of each of the unique boron pipes thus obtained was about $14 \times 10^8$ cm. The preferable thickness of the crystal boron layer in the double boron layer is 2 to 10 microns.

Figure 2:
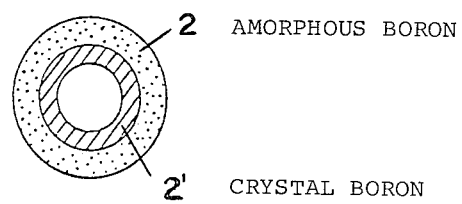
FIG. 2 is a schematic depiction of a cross-section of a boron pipe cantilever in accordance with the present invention.

It was further confirmed that similar results could be obtained irrespective of whether the CVD atmosphere had a reduced pressure or an ordinary pressure, and whether the cross section of the metal substrate was rectangular or of any other forms. FIG. 2 schematically shows a cross section of the double-layer boron pipe cantilever, where reference numeral 2 is an amorphous boron layer, and 2' is a crystal boron layer.

EXAMPLE 7

Two tungsten wires and seven tantalum wires each of 150 microns in diameter were prepared. On each of the wires, an amorphous boron layer of 60 microns of either single layer structure or multi-layer structure was CVD-deposited by either performing a long continuous CVD or by intermittent CVD as afore described. Each wire was then cut into wire segments, and these wire segments were subjected to etching so as to produce boron pipes. Table 7 lists the thickness of the single amorphous layer or each layer in the amorphous multi-layers, and the measured mechanical strengths of the boron pipes. In Table 7, sample Nos. 1 and 2 are comparative samples. The mechanical strengths shown therein are relative values on the basis that the mechanical strength of the amorphous single layer of 60 microns made by using a tungsten wire substrate is 100.

It is apparent from Table 7 that the unique boron pipes have high mechanical strengths. Each of such unique boron pipes had an elastic ratio of $14 \times 10^8$ to $16 \times 10^8$ cm.

It was confirmed that similar good results could be obtained regardless of the gas pressure in CVD and of cross section forms of the metal substrate.

TABLE 1

| No. | Substrate | Etchant | Etching Required etching | Etching Comment | Mechanical strength | Comment |
|---|---|---|---|---|---|---|
| 1 | Ta | aqueous solution of HF | over 48 hr | boron is broken at 48 hr | — | boron completely broken finally |
| 2 | Ta | aqueous solution of KOH + $H_2O_2$ | over 120 hr | — | — | — |
| 3 | Ta | 100 ml absolute methanol* plus 25 g bromine | about 15 hr | good | high | — |
| 4 | Ta | absolute methanol* saturated solution of iodine | about 75 hr | good | high | — |
| 5 | Ta | 100 ml absolute methanol* plus 25 g ICl | about 30 hr | good | a little high | — |
| 6 | Ta | absolute methanol* saturated solution of $ICl_3$ | about 15 hr | good | high | — |
| 7 | Ta | 100 ml absolute methanol* plus 25 g IBr | about 70 hr | good | a little high | — |

*Commercially available absolute methanol for Karl Fischer measurement

TABLE 2

| No. | Substrate temperature | Crystal forms of boron | Etching | Mechanical strength |
|---|---|---|---|---|
| 1 | 1100° C. | amorphous (non-crystal) | Boron is a little likely to break by etching | high |
| 2 | 1150° C. | amorphous plus α-rhombohedral | Boron is a little likely to break by etching | medium |
| 3 | 1250° C. | β-rhombohedral | Boron hardly breaks by etching | high |
| 4 | 1350° C. | β-rhombohedral plus tetragonal | Boron hardly breaks by etching | medium |

TABLE 3A

| No. | Chromium coating method | Thickness of chromium layer | Production yield after etching | Mechanical strength |
|---|---|---|---|---|
| 1 | none | 0 micron | about 10% (most are broken by etching) | low |
| 2 | DC. sputtering | 1.5 microns | about 100% | high |
| 3 | AC. sputtering | 1.0 micron | about 100% | high |
| 4 | DC sputtering of 0.2 micron Fe and then Cr plating | 8.0 microns | about 85% | a little high |
| 5 | CVD ($CrI_2 + H_2 \rightarrow Cr + 2HI$) | 2.0 microns | about 100% | high |
| 6 | AC sputtering | 0.1 micron | about 20% (many are broken by etching) | low |
| 7 | AC sputtering | 0.4 micron | about 80% | a little high |
| 8 | AC sputtering | 0.5 micron | about 100% | high |
| 9 | AC sputtering | 4.5 microns | about 100% | high |
| 10 | AC sputtering | 6.0 microns | about 100% | a little high |

TABLE 3B

| No. | Chromium coating method | Thickness of chromium layer | Production yield after etching | Mechanical strength |
|---|---|---|---|---|
| 1 | DC sputtering of Cr and then boronizing using $BCl_3$ | 1.2 microns | about 100% | high |
| 2 | AC sputtering of Cr and then boronizing using $BCl_3$ | 1.0 micron | about 100% | high |
| 3 | AC sputtering of Cr and then boronizing using $BCl_3$ | 0.35 micron | about 30% (many are broken by etching) | low |
| 4 | AC sputtering of Cr and then boronizing using $BCl_3$ | 0.53 micron | about 100% | high |
| 5 | AC sputtering of Cr and then boronizing using $BCl_3$ | 3 microns | about 100% | high |
| 6 | AC sputtering of Cr and then boronizing using $BCl_3$ | 4.5 microns | about 100% | high |
| 7 | AC sputtering of Cr and then boronizing using $BCl_3$ | 7.0 microns | about 100% | a little high |

TABLE 4

| No. | Coating material | Coating method | Thickness of coating layer (micron) | Production yield | Mechanical strength | Crystal form of boron |
|---|---|---|---|---|---|---|
| 1 | none | — | — | 3% | low | mainly amorphous |
| 2 | none | — | — | 10% | low | mainly $\beta$-rhombohedral |
| 3 | Cr | r.f. sputtering | 0.8 | 92% | high | mainly amorphous |
| 4 | alloy of Cr (90 at %) plus Fe (10 at %) | r.f. sputtering | 0.7 | 91% | high | Mainly amorphous |
| 5 | alloy of Cr (75 at %) plus Fe (25 at %) | r.f. sputtering | 0.85 | 94% | high | Mainly amorphous |
| 6 | alloy of Cr (50 at %) plus Fe (50 at %) | r.f. sputtering | 1.0 | 60% | high | Mainly amorphous |
| 7 | alloy of Cr (25 at %) plus Fe (75 at %) | r.f. sputtering | 1.0 | 40% | a little low | Mainly amorphous |
| 8 | Cr | r.f. sputtering | 0.9 | 100% | high | Mainly $\beta$-rhombohedral |
| 9 | alloy of Cr (90 at %) plus Fe (10 at %) | r.f. sputtering | 0.7 | 100% | high | Mainly $\beta$-rhombohedral |
| 10 | alloy of Cr (75 at %) plus Fe (25 at %) | r.f. sputtering | 0.8 | 100% | high | Mainly $\beta$-rhombohedral |
| 11 | alloy of Cr (50 at %) plus Fe (50 at %) | r.f. sputtering | 1.0 | 83% | high | Mainly $\beta$-rhombohedral |
| 12 | alloy of Cr (25 at %) plus Fe (75 at %) | r.f. sputtering | 1.0 | 58% | a little low | Mainly $\beta$-rhombohedral |
| 13 | Cr boride | Cr r.f. sputtering and then boronizing using $BCl_3$ | 1.2 | 98% | high | Mainly $\beta$-rhombohedral |
| 14 | boride of alloy of Cr (75 at %) plus Fe (25 at %) | alloy r.f. sputtering and then boronizing using $BCl_3$ | 1.1 | 99% | high | Mainly $\beta$-rhombohedral |
| 15 | alloy of Cr (95 at %) plus Ni (5 at %) | r.f. sputtering | 1.5 | 92% | high | Mainly amorphous |
| 16 | alloy of Cr (90 at %) plus Ni (10 at %) | r.f. sputtering | 0.9 | 80% | high | Mainly amorphous |
| 17 | alloy of Cr (60 at %) plus Ni (40 at %) | r.f. sputtering | 0.9 | 50% | a little low | Mainly amorphous |
| 18 | alloy of Cr (90 at %) plus Co (10 at %) | r.f. sputtering | 1.3 | 100% | high | Mainly $\beta$-rhombohedral |
| 19 | alloy of Cr (80 at %) plus Co (20 at %) | r.f. sputtering | 1.1 | 90% | high | Mainly $\beta$-rhombohedral |
| 20 | alloy of Cr (50 at %) plus Co (50 at %) | r.f. sputtering | 1.0 | 60% | a little low | Mainly $\beta$-rhombohedral |
| 21 | alloy of Cr (80 at %) plus Zr (20 at %) | r.f. sputtering | 1.0 | 93% | high | Mainly amorphous |
| 22 | alloy of Cr (80 at %) plus Al (20 at %) | r.f. sputtering | 1.5 | 92% | high | Mainly amorphous |
| 23 | alloy of Cr (80 at %) plus V (20 at %) | r.f. sputtering | 1.3 | 90% | high | Mainly amorphous |
| 24 | alloy of Cr (80 at %) plus Si (20 at %) | r.f. sputtering | 1.1 | 94% | high | Mainly amorphous |

TABLE 5

| No. | Substrate | Temperature of forming amorphous layer (1st process) (°C.) | Temperature of diffusing amorphous layer (2nd process) (°C.) | Crystal forms of boron deposited (3rd process) | Mechanical Strength |
|---|---|---|---|---|---|
| 1 | W | — | — | β-rhombohedral | 100 |
| 2 | Ta | — | — | β-rhombohedral | 150 |
| 3 | Ta | — | — | Amorphous | 170 |
| 4 | Ta | 800 | 1300 | β-rhombohedral | 310 |
| 5 | Ta | 900 | 1300 | β-rhombohedral | 365 |
| 6 | Ta | 1000 | 1300 | β-rhombohedral | 500 |
| 7 | Ta | 1100 | 1300 | β-rhombohedral | 510 |
| 8 | Ta | 1200 | 1300 | β-rhombohedral | |
| 9 | Ta | 1000 | 1100 | β-rhombohedral | 270 |
| 10 | Ta | 1000 | 1200 | β-rhombohedral | 470 |
| 11* | Ta | 1000 | 1300 | β-rhombohedral | 500 |
| 12 | Ta | 1000 | 1400 | β-rhombohedral | 300 |
| 13 | Ta | 1000 | 1300 | Amorphous | 570 |
| 14 | W | 1000 | 1300 | β-rhombohedral | 450 |

*Same as No. 6

TABLE 6

| No. | Substrate | Crystal forms of boron firstly deposited | Thickness of firstly deposited crystal boron layer (microns) | Thickness of secondly deposited amorphous boron layer (microns) | Mechanical strength |
|---|---|---|---|---|---|
| 1 | W | all β-rhombohedral of 30 microns | | | 100 |
| 2 | Ta | all β-rhombohedral of 30 microns | | | 100 |
| 3 | Ta | all amorphous of 30 microns | | | 120 |
| 4 | Ta | β-rhombohedral | 3 | 28 | 500 |
| 5 | Ta | β-rhombohedral | 5 | 24 | 490 |
| 6 | Ta | β-rhombohedral | 10 | 20 | 390 |
| 7 | Ta | β-rhombohedral | 20 | 10 | 250 |
| 8 | Ta | β-rhombohedral + tetragonal | 2 | 28 | 470 |
| 9 | Ta | β-rhombohedral + tetragonal | 5 | 25 | 470 |
| 10 | Ta | β-rhombohedral + tetragonal | 10 | 20 | 350 |
| 11 | Ta | β-rhombohedral + tetragonal | 20 | 10 | 200 |
| 12 | W | β-rhombohedral | 6 | 24 | 390 |

TABLE 7

| No. | Substrate | Thickness of each amorphous layer (microns) | Number of amorphous layer in boron pipe | Mechanical Strength | Comment |
|---|---|---|---|---|---|
| 1 | W | 60 | 1 | 100 | |
| 2 | Ta | 60 | 1 | 200 | Crystal borons are likely to be formed locally, and boron pipe is weak comparatively |
| 3 | Ta | 2.3 | 26 | 490 | |
| 4 | Ta | 3.5 | 17 | 620 | |
| 5 | Ta | 5.1 | 12 | 635 | |
| 6 | Ta | 10.5 | 6 | 590 | |
| 7 | Ta | 15.0 | 4 | 550 | |
| 8 | Ta | 20.3 | 3 | 430 | Surface is a little non-uniform, and boron pipe is a little weak comparatively |
| 9 | W | 4.0 | 15 | 470 | |

What is claimed is:

1. A boron cantilever in pipe form and composed of an inner layer of crystal boron and an outer layer of amorphous boron.

2. A boron cantilever according to claim 1, wherein said crystal boron layer has a thickness of 0.5 to 10 microns.

3. A boron cantilever in pipe form and composed of an amorphous multi-layer, each layer being composed of amorphous boron.

4. A boron cantilever according to claim 3, wherein each of said amorphous layers has a thickness of 3 to 15 microns.

* * * * *